(12) United States Patent
Jordan

(10) Patent No.: US 6,212,115 B1
(45) Date of Patent: Apr. 3, 2001

(54) TEST METHOD FOR CONTACTS IN SRAM STORAGE CIRCUITS

(75) Inventor: Lewis Jordan, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/619,601

(22) Filed: Jul. 19, 2000

(51) Int. Cl.[7] ....................................................... G11C 7/00
(52) U.S. Cl. ............................................................ 365/201
(58) Field of Search ................................. 365/201; 714/27

(56) References Cited

U.S. PATENT DOCUMENTS 5,845,059 * 12/1998 McClijre .......................... 395/183.03
6,002,623 * 12/1999 Stave et al. ............................ 365/201

* cited by examiner

*Primary Examiner*—Son T. Dinh
(74) *Attorney, Agent, or Firm*—Winstead Sechrest & Minick P.C.

(57) ABSTRACT

A test system for SRAM uses two mechanical probes to contact the bit lines of a column of SRAM storage cells. A word line is selected and a voltage is applied through the first mechanical probe to the first bit line forcing the second and complementary bit line to have a conducting FET coupled via contacts and a section of the second bit line to the second mechanical probe. A variable voltage is applied to the second mechanical probe and the corresponding resulting currents are measured. The first and second mechanical probes are then reversed and the process repeated. The voltage versus current from the second mechanical probe determines electrical characteristics of the contacts of the SRAM bit cell. The resulting data determining the electrical characteristics of the SRAM contacts are used to control process parameters during manufacture, set process parameters during manufacturing development, and to aid in failure analysis of manufactured SRAM bit cells.

15 Claims, 4 Drawing Sheets

TEST METHOD FOR CONTACTS IN SRAM STORAGE CIRCUITS

TECHNICAL FIELD

The present invention relates in general to test systems, and in particular, to test systems for Static Random Access Memory (SRAM) that enable testing at the chip level for specific failure modes.

BACKGROUND INFORMATION

Memory arrays implemented in integrated circuits are characterized by a matrix of storage cells that are bussed together to make a memory chip. Each memory cell is coupled with select transistors to bussed lines that connect all the cells together to form the memory array. When a word line (row select) is activated, all the memory cells in a row have their outputs coupled to a bit line (column select) or lines with select transistors. The stored data in a memory cell alters the pre-charged voltage on a bit line when the particular cell is accessed or "read". The bit line is coupled to a sense amplifier which conditions and then couples the read data external to the memory array.

In the fabrication of SRAM chips, variations in the manufacturing process may be responsible for different failure conditions. A high yield manufacturing facility requires tight control of the process parameters in the manufacturing steps used to make the SRAM chips. An SRAM typically has two bit lines (a normal and a complement) in each column that are used to coupled to the SRAM storage cells. These bit lines use the same type of metallic interconnection layer. When a fault occurs within an SRAM, it is important to know the failure mechanism. A fault may have several causes and it is important that the correct process involved in the failure be identified. When the correct process is identified, proper controls may be put in place to minimize quality problems.

One of the techniques used to determine the root cause of failures within an SRAM array is to mount the chip on a special substrate and polish thin layers of the chip away using destructive grinding. This process exposes the internal chip structure so it may be observed under a microscope. Understanding before hand what type of SRAM chip failure one is looking for may aid in how the above destructive process is carried out.

The storage cell of an SRAM is typically made up of a circuit employing two cross-coupled inverters as shown in FIG. 1B. The cross-coupled inverters 106 and 108 make up the SRAM storage cell 107 in the exemplary SRAM storage circuit 112 When SRAM storage cell 107 is read, the read out voltage level coupled to bit line BIT 103 should always be the complement of the voltage level on bit line XBIT 104. An inverter, like 106 or 108, may be constructed using an exemplary circuit connection of transistors 101 and 102 of inverter 100 in FIG. 1A. Bit lines (e.g., BIT 103 and XBIT 104) extend through an entire array and are used to read out information in each SRAM storage cell (e.g., SRAM storage cell 107) which may be coupled to the bit lines. When the exemplary word line WL 111 is selected, transistors 105 and 109 are turned on and the voltage states of the cross-coupled inverters 106 and 108 are coupled onto BIT 103 and XBIT 104.

Referring to FIG. 1B, one can observe that a variety of faults may cause the read out of data from a particular storage cell to fail. For example, the cross-coupled inverters 106 and 108 may be faulty or transistor 105 or 109 may fail. Likewise various interconnections to transistors 105 and 109, inverters 106 and 108, BIT 103 and XBIT 104 may also fail.

Knowing that the SRAM storage circuit 112 failed because of interconnect contact failure would be valuable because it would point to particular process steps that may be at fault. A method for determining that an SRAM had contact failures would improve the failure analysis of SRAMS.

SUMMARY OF THE INVENTION

Two test probes are applied to the bit lines of an SRAM storage cell. The first test probe applies a voltage to one of the two bit lines in an SRAM storage circuit while the word line of the SRAM storage circuit is selected. The applied first test probe voltage forces the other complement bit line (the one under test) to a logic zero or logic one by forcing the input to the cross-coupled inverter whose output is coupled to the bit line under test. A conduction path should exist between the bit line under test and a word line select transistor and a transistor in a cross-coupled inverter. A variable voltage is applied to the bit line under test and a resulting current is measured for each applied voltage level. By comparing test results to a voltage versus current curve of a "good" SRAM storage circuit, information about the contacts and other aspects of the SRAM storage circuit may be deduced. Analysis of the applied voltage and the resulting currents for the bit line connections to the SRAM storage circuit gives an insight into various types of possible failures or circuit degradations.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
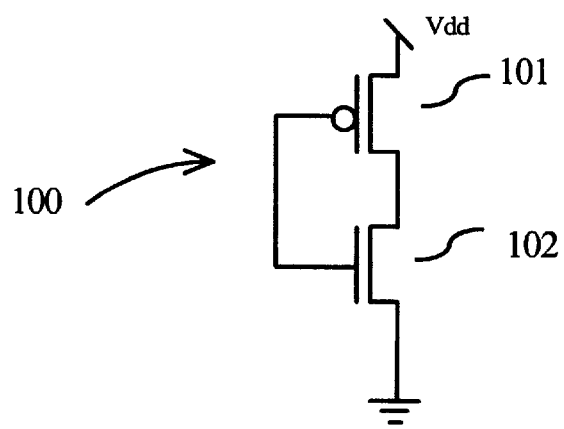
FIGS. 1A and 1B illustrate prior art circuits used in a typical SRAM storage circuit.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 1B:
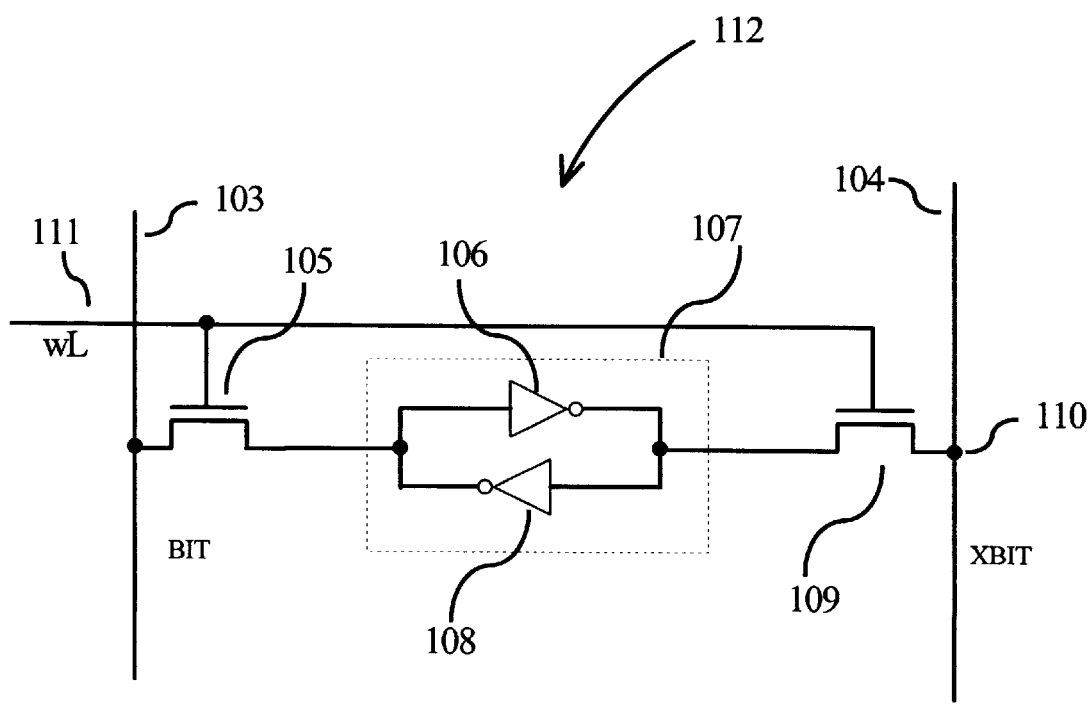

FIG. 1A is a prior art inverter circuit used in SRAM storage cells (e.g., inverters 106 and 108). FIG. 1B is a prior art SRAM storage circuit 112, comprising a SRAM storage cell 107 and select transistors 105 and 109, which is testable using embodiments of the present invention. As noted earlier in the background section of the disclosure, there are many potential failure modes of an SRAM storage circuit (e.g., SRAM storage circuit 112). Individual inverters 106 and 108 may fail as well as the word line WL 111 or selection transistors 105 and 109. Failure of these devices may prevent a particular state from being written into or read from SRAM storage cell 107. The complementary bit lines BIT 103 and XBIT 104 may also have failures in the integrity of the line conductors or in the contacts that make the connection to the devices (transistors 105, 109, and the individual transistors in inverters 106 and 108) within the SRAM storage circuit 112. An etched hole in an oxide insulator is typically made so a conductive connection may be made from the bit line conductor to a transistor (e.g., transistor 109 via connection 110). Sometimes in failure analysis it is desirable to know whether the failure is in device structure or in the interconnection structure. Devices and wiring are made in different steps of the chip making process and knowing which process is causing a particular failure aids in process control and overall manufacturing efficiency and yields.

Figure 2:
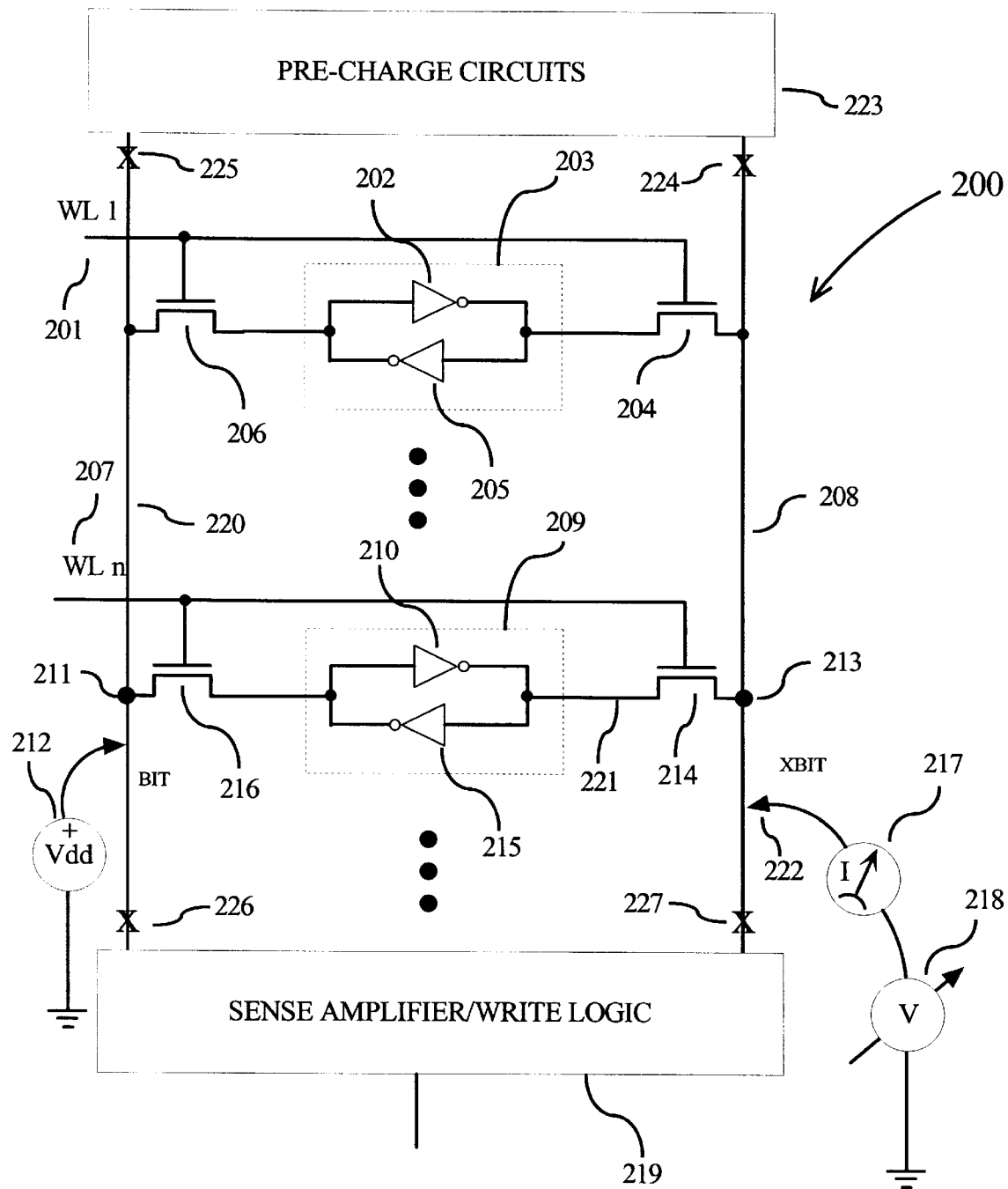
FIG. 2 is an embodiment of the present invention illustrating the application of probes in measurement of an SRAM storage circuit.

FIG. 2 is a circuit diagram illustrating embodiments of the present invention used to determine particular contact failures, for example, contacts 213 and 211. Two SRAM storage cells 203 and 209 are shown coupled with bit lines BIT 220 and XBIT 208 via select transistors 206 and 204, 216 and 214 respectively. There may be other SRAM storage cells (not shown) between SRAM storage cells 203 and 209 also coupled to bit lines BIT 220 and XBIT 208. The output of these SRAM storage cells would be read by using a sense amplifier (not shown) in sense amplifier/write logic 219. The SRAM storage cells (203 and 209) are written by selecting a word line (e.g., WL 1 or WL n) and applying complementary signals to BIT 220 and XBIT 208 with write circuits (not shown) in sense amplifier/write logic 219. For example, if a logic one is applied to BIT 220 and a logic zero to XBIT 208 and WL 1 is also set to a logic one, the output of inverter 202 will go to a logic zero which matches the signal coupled via transistor 204 and bit line XBIT 208. The cross-coupled inverters 202 and 205 will store a logic one in SRAM storage cell 203 (defined by the state of bit line BIT 220).

Embodiments of the present invention use exemplary test voltage source 212 with variable voltage 218 and current sense 217 to test various contacts (e.g., 213 and 211) within SRAM storage cells 203 and 209 or select transistors 204, 206 and 214, 216. If the contacts 211, 213, or other contacts (not highlighted) within SRAM storage cell 209 were marginal (e.g., a high resistance), it may still be possible to write and read data from SRAM storage cell 209 although the dynamics of reading and writing may be impaired and may cause unreliable or intermittent operation when operating the SRAM at high speed. The memory array column containing the exemplary SRAM storage cell 209 should be isolated from the bit line pre-charge circuits 223 and sense amplifier/write logic 219 by cutting the bit line metalization for BIT and XBIT at the points 224, 225, 226, and 227 before testing.

FIG. 2 shows voltage source 212 which is used to apply a voltage level (0 or Vdd) to bit line BIT 220. Voltage source 212 may be applied with a mechanical probe to the particular bit line BIT 220. By selecting word line WL 207 (via another tester probe not shown), the output of inverter 210 may be forced to a logic one or a logic zero (via transistor 216). Inverter 210 would typically have a circuit structure with a PFET 101 and a NFET 102 like inverter 100 as illustrated in FIG. 1A. A tester, (not shown) using variable voltage 218 and with current sense 217, may now apply a variable voltage signal to XBIT 208 via a probe connection 222. Since NFET 214 and either the PFET or NFET (not shown) internal to inverter 210 should both be on and conducting in this mode, a particular type of voltage versus current would be expected (for a good SRAM storage cell 209) when voltage source 218 is varied and the current through contact 213 is measured by current sense 217. However, if contact 213 or some other contact (e.g., contacts to the individual transistors in inverter 210, not shown) in SRAM storage cell 209 are a high resistance or open, a very different applied voltage versus measured current would result. The positions of applied voltage 212 and variable voltage source 218 may be reversed on bit lines BIT 220 and XBIT 208 to alternately measure characteristics of contact 211 and contacts to the individual transistors (not shown) in inverter 215.

By selecting other word lines (not shown), the contacts of additional SRAM storage cells (not shown) in various places within an SRAM memory array 200 may be tested. By mathematical modeling various aspects of a memory array, other types of conductive line and contact failures may yield recognizable applied voltage versus measured current curves. Embodiments of the present invention use analysis of these curves to enable identification of other various possible failure modes before destructive failure analysis determines actual failure mechanisms.

Figure 4:
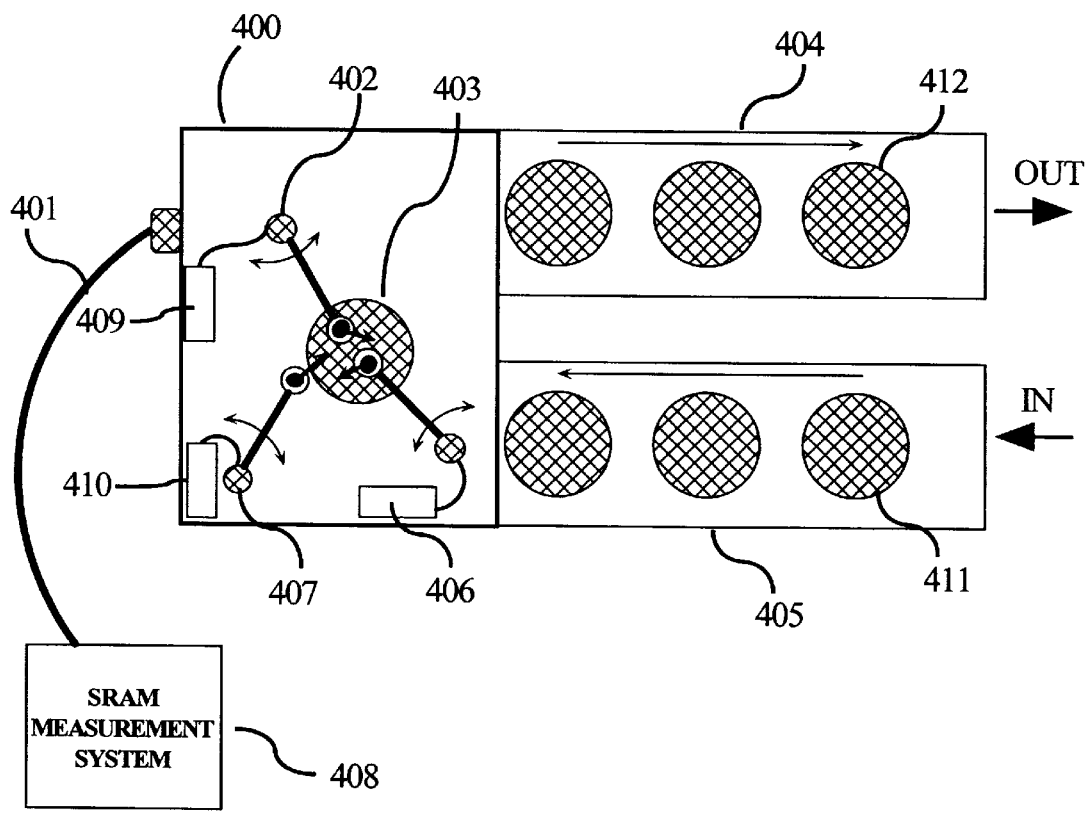
FIG. 4 is an illustration of a process control system using embodiment of the present invention.

FIG. 4 is an illustration of a process control system using embodiments of the present invention. Exemplary wafers (e.g., 411) move on wafer conveying means 405 into SRAM wafer test station 400. SRAM wafers (e.g., 412) that have been tested move from the SRAM wafer test station 400 on wafer conveying means 404. Exemplary wafer test probes 402 and 407 are moveable to contact conductors of the SRAM wafer 403 which is under test. Electronics 406, 409, and 410 comprise circuitry for testing SRAM wafers according to embodiments of the present invention. SRAM measurement system 408 receives test data via cable 401 and which is used to compare test results to stored measured or simulated voltage versus current curves. The results from SRAM measurement system 408 may then be used to control process variables of other equipment (not shown) in the SRAM manufacturing line (not shown). SRAM test station 400 may also be adapted to handle SRAM chips after they have been diced from a wafer. The only requirement is that the individual conductors that need to be contacted to complete an SRAM test according to embodiments of the present invention are accessible with exemplary wafer test probes 402 and 407.

Figure 3:
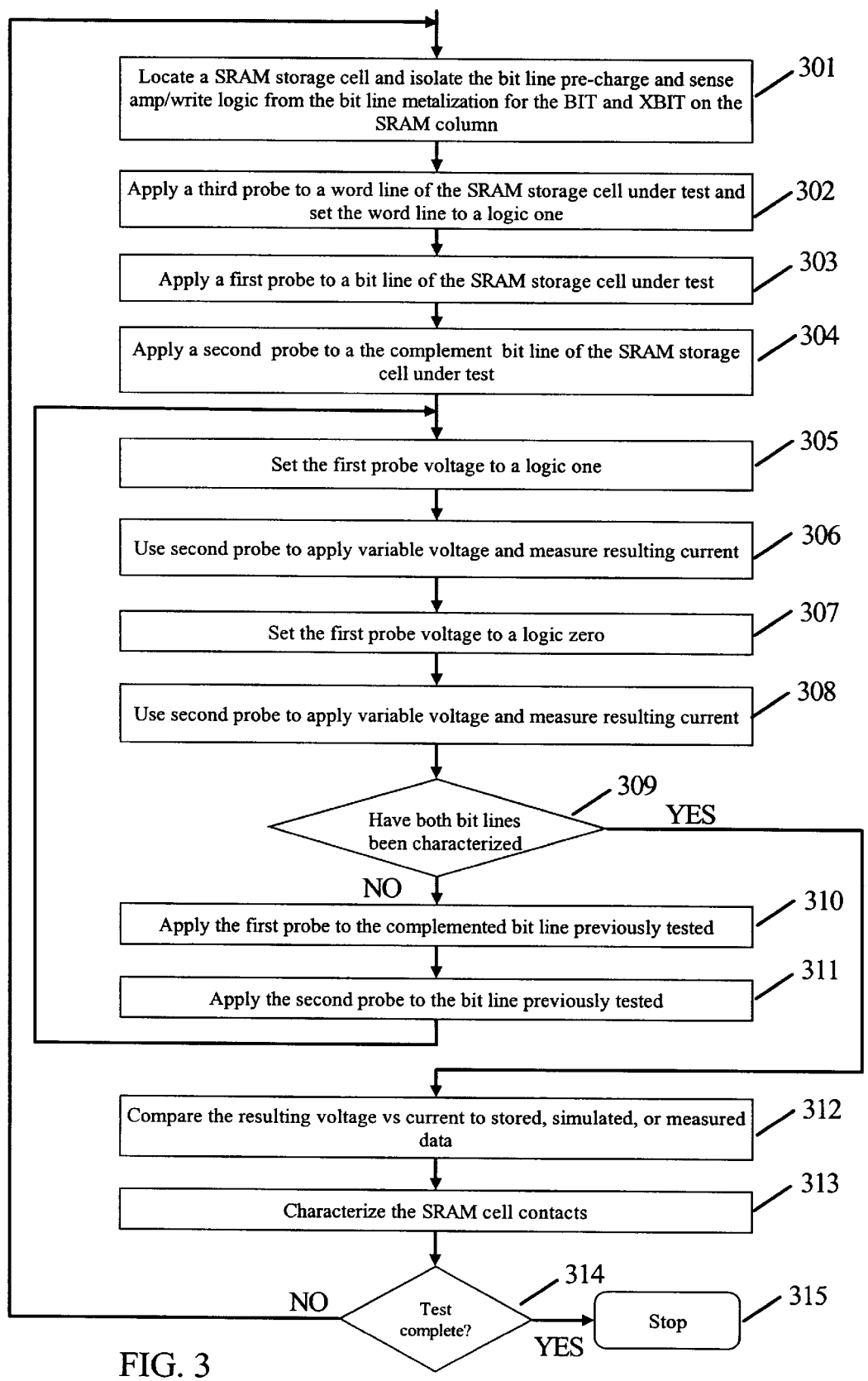
FIG. 3 is a flow diagram of method steps used in embodiments of the present invention.

FIG. 3 is a flow diagram of method steps used in embodiments of the present invention. In step 301, the SRAM storage of interest is located and the column bit lines for BIT and XBIT are isolated from the bit line pre-charge circuits 223 and sense amplifier/write logic 219 by cutting the metalization at points 224, 225,226 and 227. In step 302, a third probe is applied to the word line of the SRAM storage circuit under test. A word line is set to a logic one selecting a SRAM storage cell in a particular column. In step 303, a first probe is applied to a bit line for the SRAM storage cell. In step 304, a second probe is applied to the complement bit line of the SRAM storage cell. In step 305, a first probe is set to a logic one forcing the complement side of the SRAM storage cell to a logic zero. In step 306, a variable voltage coupled to the second probe is varied and the resulting voltages and currents measured. In step 307, the first probe is next set to a logic zero forcing the complement side of the SRAM storage cell to a logic one. In step 308, the variable voltage coupled to the second probe is varied and the resulting voltages and currents measured. In step 309, a test is made whether the characterization is complete. If both BIT and XBIT have been characterized, a branch to step 312 is executed, otherwise the characterization continues by executing a branch to step 310. In steps 310 and 311, the first and second probes are reversed allowing the opposite bit line to be characterized by executing a branch to step 305. In step 312, all the previous measured results obtained in steps 306 and 308 are compared to stored, simulated or measured curves of voltage versus current. In step 313, the contacts to the SRAM storage circuit are characterized and used to set process variables, aid in further testing, or stored for data reduction. In step 314, a test complete is checked. If testing is complete, a branch to a test stop is executed in step 315, otherwise a branch to step 301 is executed.

Although the present invention and its advantages have been described in detail, it should be understood that various changes, substitutions and alterations can be made herein without departing from the spirit and scope of the invention as defined by the appended claims.

What is claimed is:

1. A method for determining characteristics of contacts in Static Random Access Memory (SRAM) circuits comprising the method steps of:
   selecting a first word line of a particular row containing an SRAM storage circuit;
   applying a voltage to a first bit line in a column containing said SRAM storage circuit;
   applying a variable voltage to a corresponding first complement bit line of said first bit line in said column containing said SRAM storage circuit; and
   varying said variable voltage over a voltage range while said selected first word line remains selected and measuring and recording the resulting current levels and corresponding variable voltage levels.

2. The method of claim 1, wherein each of said SRAM storage circuits comprises:
   an SRAM storage cell, said SRAM storage cell comprising two cross-coupled inverters; and
   bit line selection transistors.

3. The method of claim 1, further comprising the step of using said variable voltage and corresponding resulting currents to determine electrical characteristics of contacts in said SRAM storage circuits.

4. The method of claim 1, further comprising the step of isolating said first bit line and said first complement bit line from corresponding bit line pre-charge circuits and sense amplifier/write logic.

5. The method of claim 3, further comprising the step of using said electrical characteristics in determining process control parameters in an SRAM manufacturing line.

6. A test system for a Static Random Access Memory (SRAM), said test system comprising:
   a first and a second test probe, said first probe operable to contact a first bit line and said second test probe operable to contact a first complement bit line;
   a third test probe operable to contact and force a selected word line to a known state;
   a voltage source coupled to said first test probe, said voltage source operable to force said first bit line associated with said selected word line to a known state;
   a variable voltage coupled to said second test probe;
   a current sense means operable to measure the current of said variable voltage; and
   a storage circuit for storing voltage levels of said variable voltage and corresponding resulting current levels when said variable voltage is applied to SRAM storage circuits in said SRAM.

7. The test system of claim 6, wherein said SRAM storage circuits comprise:
   an SRAM storage cell, said SRAM storage cell comprising two cross-coupled inverters; and
   bit line selection transistors.

8. The test system of claim 6, wherein said variable voltage and said corresponding resulting currents are used to determine electrical characteristics of contacts in said SRAM storage circuits.

9. The test system of claim 6, wherein said first bit line and said first complement bit line are isolated from corresponding bit line pre-charge circuits and sense amplifier/write logic.

10. The test system of claim 8, wherein said electrical characteristics are used in determining process control parameters in an SRAM manufacturing line.

11. A process control system for a SRAM manufacturing line comprising:
    a wafer or packaged unit handling system for placing an SRAM wafer or packaged unit in a test station;
    an alignment system for aligning test probes to SRAM storage circuits;
    an SRAM measurement system, said SRAM measurement system further comprising;
      a first and a second test probe, said first probe operable to contact a first bit line and said second test probe operable to contact a first complement bit line;
      a third test probe operable to contact and force a selected word line to a known state;
      a voltage source coupled to said first test probe, said voltage source operable to force said first bit line associated with said selected word line to a known state;
      a variable voltage coupled to said second test probe;
      a current sense means operable to measure the current of said variable voltage; and
      a storage circuit for storing voltage levels of said variable voltage and corresponding resulting current levels when said variable voltage is applied to said SRAM storage circuits.

12. The process control system of claim 11, wherein each of said SRAM storage circuits comprises:
    an SRAM storage cell, said SRAM storage cell comprising two cross-coupled inverters; and
    bit line selection transistors.

13. The process control system of claim 11, wherein said variable voltage and said corresponding resulting currents are used to determine electrical characteristics of contacts in said SRAM storage circuits.

14. The process control system of claim 11, wherein said first bit line and said first complement bit line are isolated from corresponding bit line pre-charge circuits and sense amplifier/write logic.

15. The process control system of claim 13, wherein said electrical characteristics of contacts are used in determining process control parameters in an SRAM manufacturing line.

* * * * *